US008487650B2

(12) United States Patent
Fazeel et al.

(10) Patent No.: US 8,487,650 B2
(45) Date of Patent: Jul. 16, 2013

(54) METHODS AND CIRCUITS FOR CALIBRATING MULTI-MODAL TERMINATION SCHEMES

(75) Inventors: Hajee Mohammed Shuaeb Fazeel, Bangalore (IN); Amir Amirkhany, Sunnyvale, CA (US); Gundlapalli Shanmukha Srinivas, Bangalore (IN); Chaofeng Huang, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/349,226

(22) Filed: Jan. 12, 2012

(65) Prior Publication Data

US 2012/0187978 A1  Jul. 26, 2012

Related U.S. Application Data

(60) Provisional application No. 61/436,124, filed on Jan. 25, 2011.

(51) Int. Cl.
*H03K 17/16* (2006.01)
(52) U.S. Cl.
USPC .............................................. 326/30; 326/27
(58) Field of Classification Search
USPC ........................................................ 326/30
See application file for complete search history.

(56) References Cited

U.S. PATENT DOCUMENTS

| 6,765,406 | B2 | 7/2004 | Jang et al. ......................... 326/30 |
| 6,815,979 | B2 * | 11/2004 | Ooshita ........................... 326/30 |
| 6,873,503 | B2 | 3/2005 | Amick et al. ..................... 361/18 |
| 6,885,226 | B2 | 4/2005 | Waldrop .......................... 327/112 |
| 6,924,660 | B2 | 8/2005 | Nguyen et al. ................... 326/30 |
| 7,389,194 | B2 | 6/2008 | Nguyen et al. ................. 702/107 |
| 7,439,760 | B2 | 10/2008 | Nguyen ........................... 326/30 |
| 7,443,193 | B1 * | 10/2008 | Santurkar et al. ............... 326/30 |
| 7,710,144 | B2 | 5/2010 | Dreps et al. ..................... 326/30 |
| 7,755,385 | B2 | 7/2010 | Sreeramaneni .................. 326/30 |
| 2004/0000924 | A1 | 1/2004 | Best et al. ........................ 326/30 |
| 2004/0056681 | A1 | 3/2004 | Amick et al. ..................... 326/68 |
| 2009/0091349 | A1 | 4/2009 | Bhakta et al. .................... 326/30 |
| 2010/0202227 | A1 | 8/2010 | Nguyen et al. ................. 365/198 |

OTHER PUBLICATIONS

Qimonda GDDR5 White Paper, Aug. 2007. 10 pages.

* cited by examiner

*Primary Examiner* — Shawki Ismail
*Assistant Examiner* — Jany Richardson
(74) *Attorney, Agent, or Firm* — Silicon Edge Law Group LLP; Arthur J. Behiel (57) ABSTRACT

Disclosed are methods and circuits that support different on-die termination (ODT) schemes for a plurality of signaling schemes using a relatively small number of external calibration pads. These methods and circuits develop control signals for calibrating any of multiple termination schemes that might be used by associated communication circuits. The ODT control circuits, entirely or predominantly instantiated on-die, share circuit resources employed in support of the different termination schemes to save die area.

19 Claims, 5 Drawing Sheets

METHODS AND CIRCUITS FOR CALIBRATING MULTI-MODAL TERMINATION SCHEMES

FIELD

The subject matter presented herein relates generally to the field of communications, and more particularly to high speed electronic signaling within and between integrated circuit devices.

BACKGROUND

High-speed data communication integrated circuit (IC) dies are known to include both drivers and receivers. The driver of one such IC connects to the receiver of another via one or more signal transmission lines. Both the driver and receiver circuits include termination elements that attempt to match the characteristic impedance of the transmission line to the output impedance of the driver and input impedance of the receiver, as impedance mismatches degrade signal quality and consequently reduce communication speed and reliability.

Some conventional communication systems employ control systems that calibrate the impedance of on-die termination (ODT) elements for improved impedance matching. These systems work well in many applications. Still, high-speed data communication circuits must achieve ever greater performance levels, at competitive prices, to satisfy customer demand. Furthermore, different customers typically have different requirements that may not be met by a given ODT configuration. One customer might favor power efficiency over speed, or may prefer different termination voltages or impedances. There is therefore a need for ODT circuits that offer customers access to a broader range of termination topologies and values. Further, each supported topology or value should be capable of precise calibration to account for process variations. Such calibration might be repeated as needed to compensate for changes due to supply-voltage and temperature fluctuations.

BRIEF DESCRIPTION OF THE DRAWINGS

The subject matter presented herein is illustrated by way of example, and not by way of limitation, in the figures of the accompanying drawings and in which like reference numerals refer to similar elements and in which.

DETAILED DESCRIPTION

Figure 1:
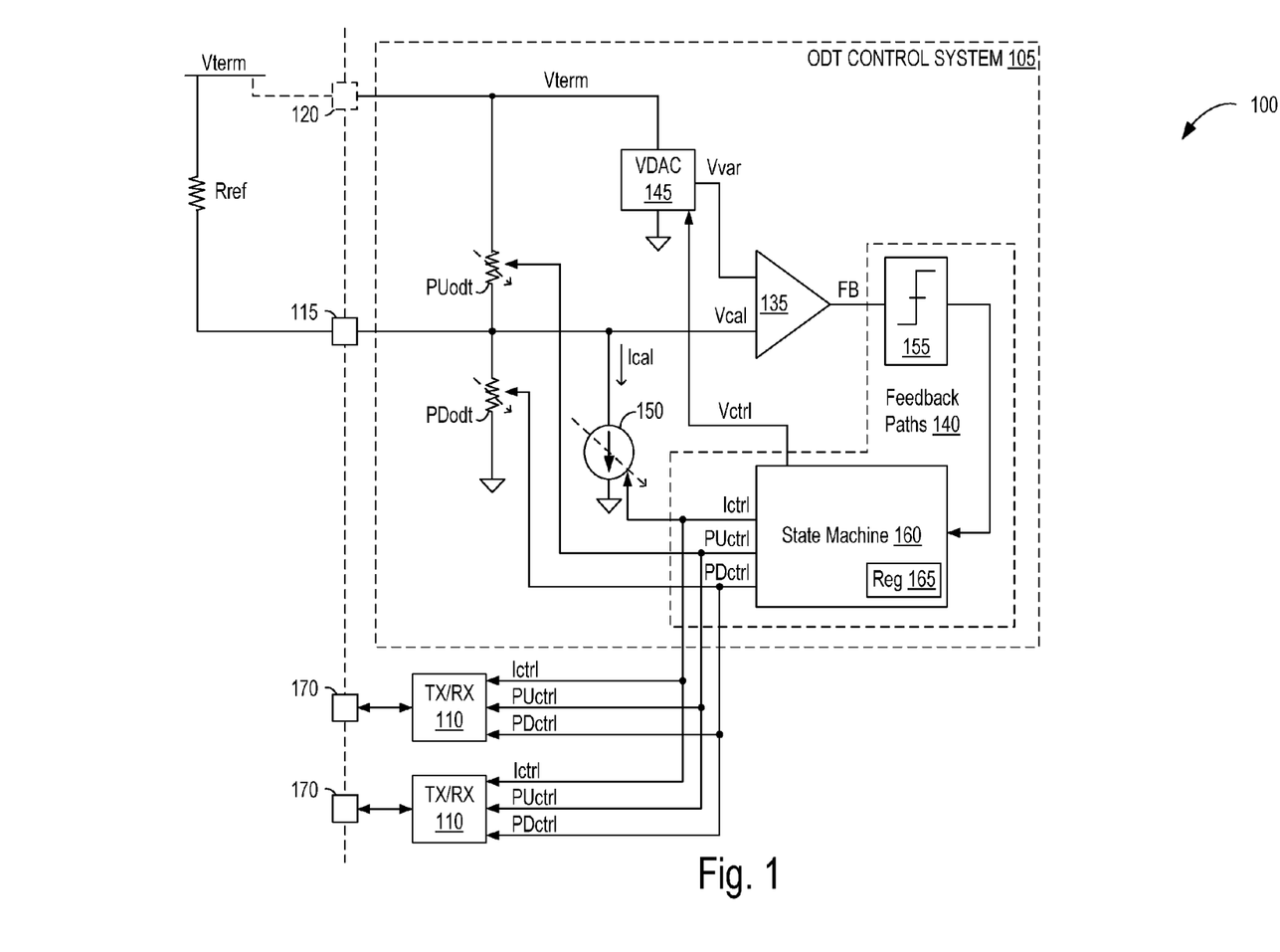
FIG. 1 depicts an integrated circuit (IC) die 100 that supports on-die termination (ODT) configurations for a plurality of signaling schemes.

FIG. 1 depicts an integrated circuit (IC) die 100 that supports on-die termination (ODT) configurations for a plurality of signaling schemes. In this embodiment, an ODT control system 105 can be configured to derive appropriate termination settings for a pair of communication circuits 110, each of which supports four signaling schemes. Control system 105 achieves this flexibility using just two external calibration pads 115 and 120. Other embodiments use but one, as noted below. Minimizing the number of external pads is important because the density of ICs has risen markedly faster than the number of pads available to convey external signals. As a result, many ICs are pad limited, which is to say that the area and cost of ICs are largely determined by the requisite number of external signaling pads. Also advantageous, control system 105 shares components used in calibrating ODT configurations for different signaling schemes, and consequently reduces the area required in support of ODT calibration.

Control system 105 includes a pair of replica termination elements PUodt and PDodt, each of which is connected between a respective supply voltage and calibration pad 115. Elements PUodt and PDodt are termed "replica" because they are fabricated to replicate the properties of corresponding termination elements within communication circuits 110. Calibration signals derived based on such replicas can thus be distributed on the die to calibrate communication circuits 110.

Control system 105 additionally includes a comparator 135, feedback paths 140, a variable voltage source 145, and a variable current source 150. Feedback paths 140 includes a sampler 155 and state machine 160 to provide control signals Vctrl and Ictrl to the respective voltage and current sources 145 and 150, and to provide impedance control signals PUctrl and PDctrl to respective termination elements PUodt and PDodt. ODT control signals PUctrl and PDctrl and current-control signal Ictrl are conveyed to communication circuits 110 to calibrate ODT elements (FIGS. 7A-7C) as appropriate for the selected communication topologies and system environment. State machine 160 may include a register 165 to store a value indicative of a selected signaling scheme. Communication circuits 110 can be transmitters, receivers, or transceivers adapted to communicate e.g. single-ended or differential signals via respective communication pads 170. Communication circuits 110 support multiple signaling schemes, examples of which are detailed below.

State machine 160 issues control signals to calibrate the values of replica termination elements PUodt and PDodt. This calibration is based on a precision external resistor Rref and voltage Vterm as standards for calibration. State machine 160 generates the requisite control signals by adjusting voltage source 145 and current source 150 while sensing feedback signal FB from comparator 135. In some embodiments voltage Vterm is generated using an internal power supply and pad 120 is repurposed for e.g. communication.

Figure 2:
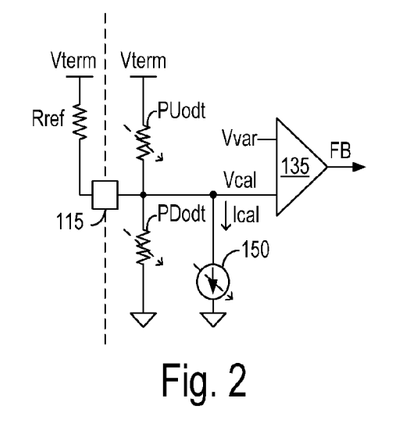
FIG. 2 is a simplified schematic of control system PDodt of FIG. 1.

FIG. 2 is a simplified schematic of control system PDodt of FIG. 1. Elements with dashed arrows have properties that can be adjusted by application of appropriate control signals from state machine 160 of FIG. 1. Voltage source 145, a voltage DAC in the embodiment of FIG. 1, is also variable and is used in the calibration schemes discussed below. Voltage source 145 is omitted from the following figures for ease of illustration, but its output voltage Vvar is included where helpful in understanding ODT calibration procedures.

FIGS. 3A-3D together illustrate a calibration scheme in accordance with an embodiment in which communication circuits 110 are configured to communicate using a scheme that supports GDDR5 (Graphics Double Data Rate, version 5) memory. GDDR5 memory conforms to standards set in a GDDR5 specification by JEDEC. Most of the operational details of GDDR5 memory are beyond the scope of the present disclosure. Of interest, GDDR5 memory chips communicate using a supply voltage of 1.5 volts and a termination scheme commonly referred to as pseudo-open-drain logic (PODL). The depicted calibration scheme allows state machine 160 to determine the requisite drive and termination impedances for transmitting and receiving data. The topology of a PODL driver configuration is described below in connection with FIG. 7A.

The hardware associated with each of FIGS. 3A-3D is identical: the differences between the figures reflect configuration changes initiated by state machine 160 during a calibration sequence. The particular sequence and resultant termination values depends on the signaling scheme to be supported, which may be indicated by a value stored in register 165. Though not shown, state machine 160 may additionally receive a signal indicating whether circuits 110 are transmitting or receiving data, and may present ODT control signals accordingly.

Figure 3A:
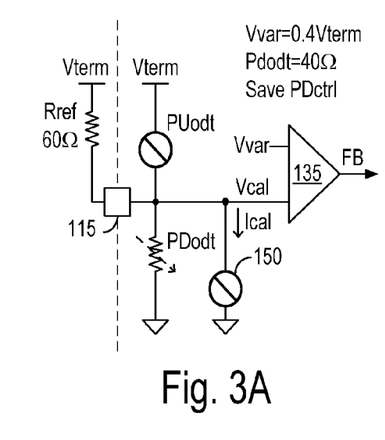
FIGS. 3A-3D together illustrate a calibration scheme in accordance with an embodiment in which communication circuits 110 are configured to communicate using a scheme that supports GDDR5 (Graphics Double Data Rate, version 5) memory.

With reference to FIG. 3A, a 60 ohm external resistor Rref is disposed between calibration pad 115 and an external voltage source that supplies termination voltage Vterm (e.g. 1.5 volts). State machine 160 sets voltage Vvar to 0.4 Vterm (i.e., 40% of voltage Vterm) and disables (opens) pull-up termination element PUodt and current source 150. State machine 160 then adjusts the impedance of pull-down termination element PDodt responsive to feedback signal FB. State machine 160 will adjust this impedance until calibration voltage Vcal on calibration pad 115 equals, or very nearly equals, voltage Vvar. In this example, voltage Vcal will settle on 0.4 Vterm when termination element PDodt is set to 40 ohms. State machine 160 saves the value of control signal PDctrl once the impedance of element PDodt settles, e.g. after a selected number of clock cycles. This value of control signal PDctrl can be distributed to termination elements in communication circuits 110 to calibrate their transmission pull-down impedance to 40 ohms.

Figure 3B:
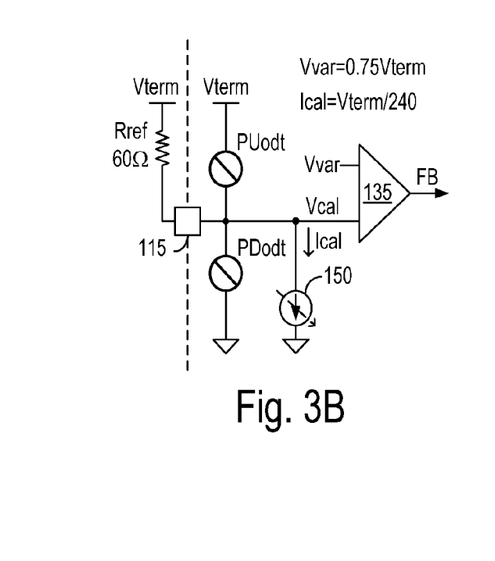

Next, as shown in FIG. 3B, state machine 160 sets voltage Vvar to 0.75 Vterm and disables both replica termination elements PUodt and PDodt. State machine 160 then adjusts the current through source 150, responsive to feedback signal FB, until calibration voltage Vcal on calibration pad 115 equals, or very nearly equals, voltage Vvar. In this example, voltage Vcal will settle on 0.75 Vterm when the current Ical through current source 150, and thus external resistor Rref, is Vterm/240. State machine 160 saves the value of control signal Ictrl to source 150 once the voltage Vcal settles. This setting is then used in the next step to calibrate the value of replica impedance PUodt.

Figure 3C:
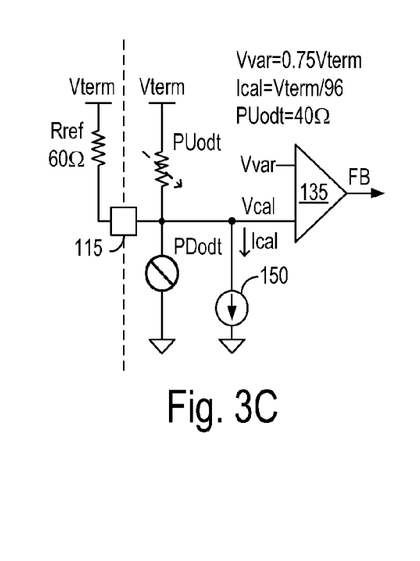

Turning to FIG. 3C, state machine 160 retains voltage Vvar at 0.75 Vterm and continues to disable replica termination element PDodt. State machine 160 also increases current Ical 250% by adjusting current source 150, which leaves current Ical at Vterm/96. This division can be accomplished by simply enabling 2.5 times the number of parallel current paths as used to calibrate Ical in the step of FIG. 3B. Then, responsive to feedback signal FB, state machine 160 adjusts the impedance through pull-up element PUodt until calibration voltage Vcal on calibration pad 115 once again reaches voltage Vvar. In this example, voltage Vcal will settle on 0.75 Vterm when the impedance of that replica element is 40 ohms. State machine 160 saves this value of control signal PUctrl, which is used to calibrate the transmission pull-up impedance of communication circuits 110 to 40 ohms.

Figure 3D:
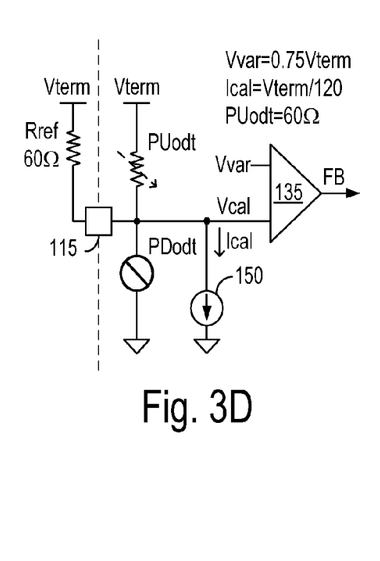

GDDR5 communication schemes are bidirectional. When receiving data, the GDDR5 termination topology includes a pull-up termination of 60 ohms. To calibrate this impedance, current Ical is once again adjusted, this time to Vterm/120, or twice the current employed in the process of FIG. 3B. As before, and responsive to feedback signal FB, state machine 160 adjusts the impedance of pull-up element PUodt until calibration voltage Vcal on calibration pad 115 reaches voltage Vvar. In this example, voltage Vcal will settle on 0.75 Vterm when the impedance of that replica element is 60 ohms. State machine 160 saves this value of control signal PUctrl to share with communication circuits 110 (FIG. 1) when receiving data.

The PODL termination topology for GDDR5 uses a termination voltage Vterm of 1.5 volts. Other termination voltages are possible. For example, other single-ended topologies employ a termination voltage of one volt. The calibration scheme of FIGS. 3A-3D works equally well for this and other embodiments.

FIGS. 4A-4E together illustrate a calibration scheme in accordance with an embodiment in which communication circuits 110 are configured to communicate using a scheme that supports DDR3 (Double Data Rate, version 3) memory. Most of the operational details of DDR3 memory are beyond the scope of the present disclosure. Of interest, DDR3 memory chips communicate using a supply voltage of 1.5 volts and a termination scheme commonly referred to as sub-series terminated logic (SSTL). The hardware associated with each of FIGS. 4A-4E is identical, and may be as detailed previously in connection with FIG. 1 to support multiple termination schemes. The signaling scheme may be represented to state machine 160 by writing a value to register 165. Register 165 is depicted within state machine 160, but can be elsewhere on the die. The topology of an SSTL driver configuration described below in connection with FIG. 7B.

Figure 4A:
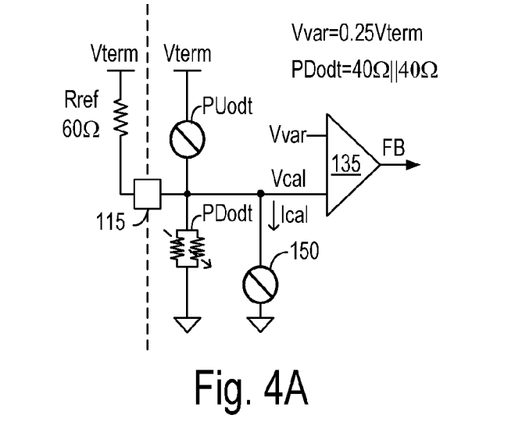
FIGS. 4A-4E together illustrate a calibration scheme in accordance with an embodiment in which communication circuits 110 are configured to communicate using a scheme that supports DDR3 (Double Data Rate, version 3) memory.

With reference to FIG. 4A, a 60 ohm external resistor Rref is disposed between calibration pad 115 and an external voltage source that supplies termination voltage Vterm (e.g. 1.5 volts). State machine 160 sets voltage Vvar to 0.25 Vterm (i.e., 25% of voltage Vterm) and disables pull-up termination element PUodt and current source 150. State machine 160 then adjusts the impedance of pull-down termination element PDodt responsive to feedback signal FB. State machine 160 will adjust this impedance until Vcal will settles on 0.25 Vterm, which occurs when termination element PDodt is set to 20 ohms. Element PDodt is represented here as two variable resistors in parallel and similarly adjusted to 40 ohms each (i.e., 40∥40). State machine 160 saves the value of control signal PDctrl once the impedance of element PDodt settles. This value of control signal PDctrl can be distributed to termination elements elsewhere in IC 100 to calibrate their transmission pull-down impedance to 40 ohms.

Figure 4B:
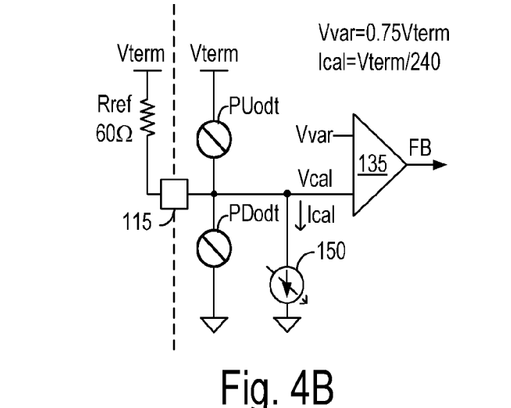

Next, as shown in FIG. 4B, state machine 160 sets voltage Vvar to 0.75 Vterm and disables both replica termination elements PUodt and PDodt. State machine 160 then adjusts the current through source 150, responsive to feedback signal FB, until voltage Vcal settles on 0.75 Vterm. This condition occurs when the current Ical through current source 150, and thus external resistor Rref, is Vterm/240. State machine 160 saves the value of control signal Ictrl to source 150 once the voltage Vcal settles. This setting is then used in the next step to calibrate the value of replica impedance PUodt.

Figures 4C, 4D:
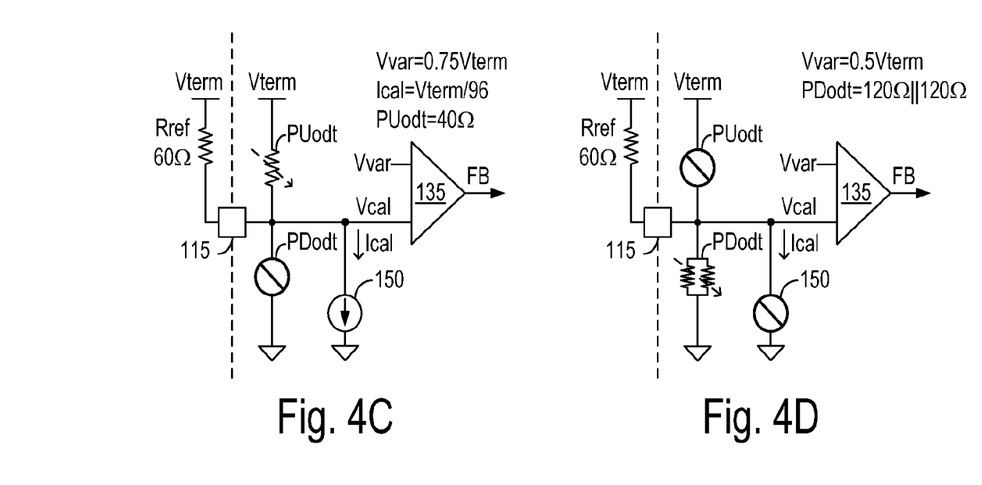

Turning to FIG. 4C, state machine 160 retains voltage Vvar at 0.75 Vterm and continues to disable replica termination element PDodt. State machine 160 also increases current Ical 250% by adjusting current source 150, which leaves current Ical at Vterm/96. Then, responsive to feedback signal FB, state machine 160 adjusts the impedance through pull-up element PUodt until calibration voltage Vcal on calibration pad 115 once again equals, or very nearly equals, voltage Vvar. In this example, voltage Vcal will settle on 0.75 Vterm when the impedance of that replica element is 40 ohms. State machine 160 saves this value of control signal PUctrl, which is used to calibrate their transmission pull-up impedance to 40 ohms.

When receiving data, the SSTL termination topology that is the subject of calibration in FIGS. 4A-4E includes pull-up and pull-down termination elements of 120 ohms each. To calibrate the pull-down impedance, as illustrated in FIG. 4D, state machine 160 sets variable voltage Vvar to 0.5 Vterm and disables both current source 150 and pull-up termination element PUodt. State machine 160 then adjusts the impedance through termination element PDodt until calibration voltage Vcal equals, or very nearly equals, voltage Vvar. In this example, voltage Vcal will settle on 0.5 Vterm when the impedance of that replica element is 60 ohms, which is arrived at by identically adjusting parallel termination structures. As a consequence, the setting for each of the parallel structures in termination element PDodt represents the correct setting for achieving a 60-ohm pull-down impedance. State machine 160 saves this value of control signal PDctrl to share with communication circuits 110 (FIG. 1) for receipt of data.

Figure 4E:
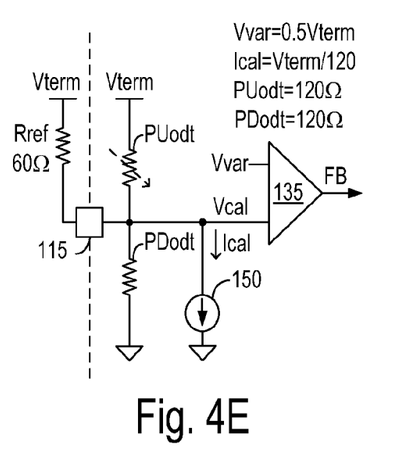

In a final procedure, illustrated in FIG. 4E, state machine 160 determines the correct setting of control signal PUctrl to set the pull-up termination impedance of element PUodt to 120 ohms. State machine 160 sets variable voltage Vvar to 0.5 Vterm, sets current Ical to Vterm/120, and enables half of replica element PDodt at the setting derived in the procedure illustrated in FIG. 4D to set the pull-down impedance to 120 ohms. State machine 160 then adjusts the impedance through termination element PUodt until calibration voltage Vcal settles on voltage Vvar. In this example, voltage Vcal will settle on 0.5 Vterm when the parallel resistance of reference resistor Rref and element PUodt is 40 ohms, which occurs when the impedance of replica element PUodt is 120 ohms. State machine 160 saves the requisite value of control signal PUctrl to share with communication circuits 110 (FIG. 1) when configured to receive data.

Figure 5A:
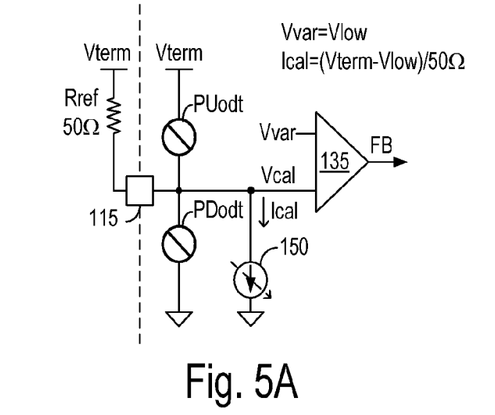
FIGS. 5A and 5B together illustrate a calibration scheme in accordance with an embodiment in which communication circuits 110 are configured to send and receive low-voltage differential signals (LVDS) and are configured to support a common-mode (CM) termination scheme.
Figure 5B:
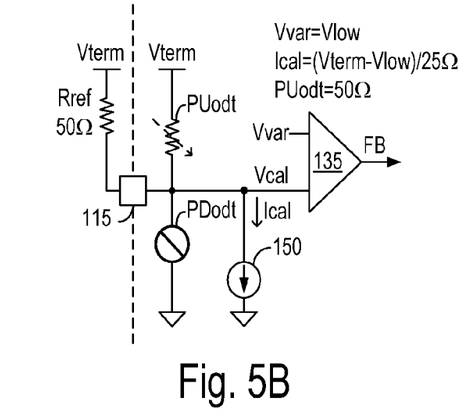

FIGS. 5A and 5B together illustrate a calibration scheme in accordance with an embodiment in which communication circuits 110 are configured to send and receive low-voltage differential signals (LVDS) and are configured to support a common-mode (CM) termination scheme. This calibration scheme can be accomplished using the same circuitry discussed previously in connection with FIGS. 1 and 2. The topology of a CM-terminated differential driver is described below in connection with FIG. 7C.

With reference to FIG. 5A, a 50 ohm external resistor Rref is disposed between calibration pad 115 and an external voltage source that supplies termination voltage Vterm (e.g. 1.0 volts). State machine 160 sets voltage Vvar to a common-mode voltage Vlow, 0.5 Vterm in this example, and disables both replica termination elements. State machine 160 then adjusts current Ical responsive to feedback signal FB until voltage Vcal on calibration pad 115 settles on voltage Vvar. In this example, voltage Vcal will settle on 0.5 Vterm when current Ical is set to Vterm-Vlow/50 ohms. Next, as shown in FIG. 5B, state machine 160 doubles current Ical and adjusts replica termination element PUodt until voltage Vcal settles on voltage Vlow, in which case the resistance through element PUodt will be at or near 50 ohms. This value is used to establish appropriate termination values for both transmit and receive when communication circuits 110 are configured in the differential, common-mode terminated scheme of this example.

Figure 6:
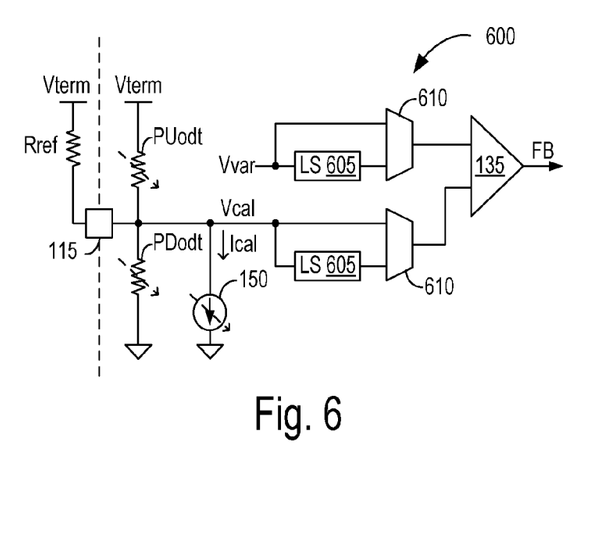
FIG. 6 illustrates an ODT control system 600 in accordance with another embodiment.

FIG. 6 illustrates an ODT control system 600 in accordance with another embodiment. Control system 600 is similar to control system 105 of FIG. 1, with like-identified elements being the same or similar. Control system 600 additionally includes a pair of level shifters 605 and corresponding multiplexers 610. At the direction of state machine 160 (FIG. 1), multiplexers 610 can select raised versions of voltage Vvar and Vcal for application to the input nodes of comparator 135. This allows system 600 to keep the applied voltage within the operational range of comparator 135.

Figure 7A:
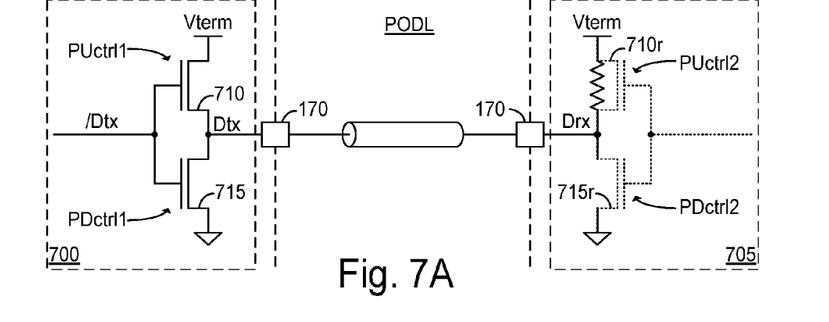
FIG. 7A illustrates a driver 700 and receiver 705 on respective IC die and configured to support a PODL termination scheme.

FIG. 7A illustrates a driver 700 and receiver 705 on respective IC die and configured to support a PODL termination scheme. Driver 700 and receiver 705 are connected via a channel that includes communication pads 170 (FIG. 1).

Driver 700 includes pull-up and pull-down transistors 710 and 715 connected in series between nodes Vterm and ground. Transistor 710 represents multiple, parallel transistors that can be independently enabled responsive to control signal PUctrl1 to control the impedance between pad 170 and node Vterm. Transistor 715 is similar, and represents multiple, parallel transistors that can be independently enabled responsive to control signal PDctrl1 to control the impedance between pad 170 and ground. Calibration signals PUctrl1 and PDctrl1 are derived in the manner discussed above in connection with FIGS. 3A-3D to set the pull-up and pull-down impedances of driver 700 at forty ohms. This calibration determines the strength of driver 700 when transmitting a data signal Dtx to receiver 705.

Receiver 705 receives the transmitted data signal Dtx and receive signal Drx. Pad 170 on the receive side is terminated to node Vterm via a transistor 710r, which in this case is identical to transistor 710 of driver 700 but is configured to produce a constant sixty-ohm impedance while receiving data Drx. A transistor 715r like transistor 715 of driver 700 is disabled to isolate receive-side pad 170 from ground.

The roles of driver 700 and receiver 705 can be reversed to convey information in the opposite direction. An ODT control system like system 105 of FIG. 1 may be included on each IC to calibrate the pull-up and pull-down calibration signals for transmitting and receiving information.

Figure 7B:
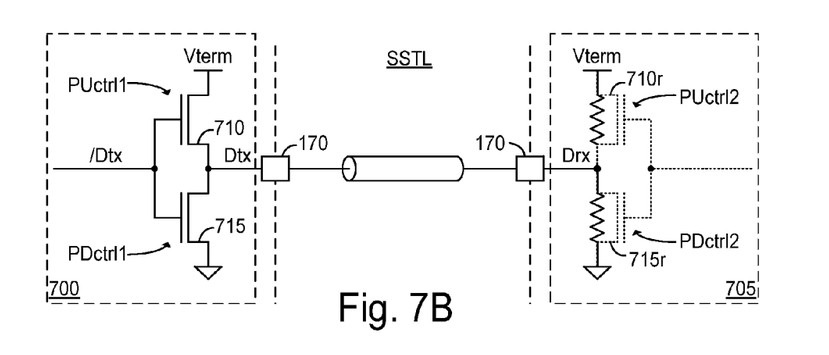
FIG. 7B illustrates driver 700 and receiver 705, introduced in FIG. 7A, configured to support a PODL termination scheme.

FIG. 7B illustrates driver 700 and receiver 705, introduced in FIG. 7A, configured to support a PODL termination scheme. The topology is similar to that of FIG. 7A, but control signals PUctrl2 and PDctrl2 are calibrated to provide respective 120 ohm termination impedances in the manner discussed above in connection with FIGS. 4A-4E. As in the prior example, the roles of driver 700 and receiver 705 can be reversed to convey information in the opposite direction.

Figure 7C:
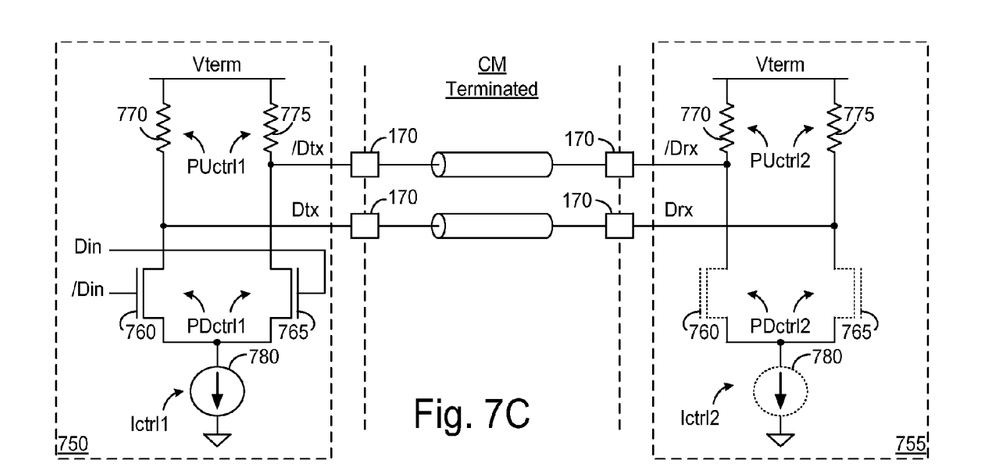
FIG. 7C illustrates a differential driver 750 and a differential receiver 755 on respective IC die and configured to support a common-mode termination scheme.

FIG. 7C illustrates a differential driver 750 and a differential receiver 755 on respective IC die and configured to support a common-mode termination scheme. Each of driver 750 and receiver includes differential transistors 760/765 with respective load impedances 770/775 and a common current source 780. On the driver side, the impedances through transistors 760 and 765 are controlled by signal PDctr11, the impedances through resistors 770/775 control signal PUctr11, and the current through current source 780 signal Ictr11. All of these control signals come from e.g. an instantiation of ODT control system 105 of FIG. 1 on the same die as driver 700. On the receiver side, transistors 760 and 765 are controlled by signal PDctr12 to provide a high impedance between each of pads 170 and ground, the impedances through resistors 770/775 are set to fifty ohms via control signal PUctr12, and current source 780 is disabled. All of these control signals come from e.g. an instantiation of ODT control system 105 of FIG. 1 on the same die as receiver 755. These signals can be calibrated in the manner detailed above in connection with FIGS. 5A and 5B. The roles of driver 750 and receiver 755 can be reversed e.g. by application of appropriate control signals from system 105, to convey information in the opposite direction.

Resistors 770 and 775 are transistors or collections of parallel transistors. In some embodiments that support single-ended and differential signaling modes resistors 770 are implemented using transistors 710A (FIGS. 7A and 7B) and transistors 760 are implemented using transistors 715 (FIGS. 7A and 7B). That is, the transistors used in a pair of single-ended drivers can be combined with a current source to form a single differential driver.

Many types of drivers may benefit from ODT control systems of the type disclosed herein. Some such drivers are detailed in PCT application PCT/US10/048,826 filed Sep. 14, 2010, entitled "High Resolution Output Driver," and incorporated herein by reference.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Similarly, signals described or depicted as having active-high or active-low logic levels may have opposite logic levels in alternative embodiments. While the example of FIG. 6 shows how both the wordline and bitline voltages may be varied in a manner that reduces current and consequently power consumption, only one of the wordline and bitline voltages can be so varied in other embodiments.

As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. Additionally, the prefix symbol "/" attached to signal names indicates that the signal is an active low signal (i.e., the asserted state is a logic low state). In any case, whether a given signal is an active low or an active high will be evident to those of skill in the art.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, variations of these embodiments are also envisioned. For example, the foregoing examples can be adapted for use in various array architectures, including the well-known open bitline and folded bitline architectures. These examples are in no way exhaustive, as many alternatives within the scope of the claims will be obvious to those of ordinary skill in the art. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. For U.S. applications, only those claims specifically reciting "means for" or "step for" should be construed in the manner required under the sixth paragraph of 35 U.S.C. §112.

What is claimed is:

1. An integrated-circuit die comprising:
    a calibration pad to connect to a reference resistance external to the die;
    a comparator having a first comparator input node coupled to the pad, a second comparator input node, and a comparator output node;
    a programmable voltage source coupled to the second comparator input node to provide a variable voltage on the second comparator input node;
    a programmable current source coupled to the pad and including a current-control port;
    a feedback path extending between the comparator output node and the current-control port; and
    a replica termination element including a termination-control port, coupled to the calibration pad and exhibiting a termination impedance responsive to the termination-control port.

2. The die of claim 1, wherein the feedback path includes a state machine, and wherein the state machine includes a voltage-control port coupled to the programmable voltage source to control the variable voltage.

3. The die of claim 2, further comprising a communication pad and at least one of a driver or a receiver that exhibits a first termination impedance between the communication pad and a supply node, wherein the first termination impedance varies responsive to a termination control signal from the state machine.

4. The die of claim 3, wherein the terminal-control port of the replica termination element is coupled to the termination control signal to control the termination impedance of the replica termination element.

5. The die of claim 4, further comprising a second replica termination element coupled to the calibration pad and exhibiting a second termination impedance responsive to a second termination control signal from the state machine.

6. The die of claim 3, wherein the state machine includes a register, and wherein the register stores a value specifying the first termination impedance.

7. A method for calibrating first and second replica on-die-termination (ODT) elements, each exhibited between a calibration pad and respective first and second supply terminals, the method comprising:
adjusting the first replica ODT element to set the calibration pad at a first voltage;
adjusting a current through the calibration pad to set the calibration pad at a second voltage different from the first voltage;
adjusting a second current through the second replica ODT element; and
while holding constant the sum of the first and second currents, adjusting the second ODT element.

8. The method of claim 7, wherein adjusting the second replica ODT element comprises setting the calibration pad to the second voltage.

9. The method of claim 7, wherein the first and second supply terminals exhibit relatively higher and lower voltages, respectively.

10. The method of claim 7, further comprising re-adjusting at least one of the first and second replica ODT elements.

11. The method of claim 10, further comprising holding the calibration pad at a third voltage while re-adjusting the at least one of the first and second replica ODT elements.

12. The method of claim 7, further comprising re-adjusting the current through the calibration pad before adjusting the second replica ODT element.

13. The method of claim 12, wherein adjusting the current comprises comparing a voltage on the calibration pad to a reference voltage and adjusting the current through a current source responsive to the comparing.

14. The method of claim 13, wherein re-adjusting the current comprises ignoring the voltage on the pad.

15. The method of claim 7, wherein the first and second replica ODT elements exhibit impedances proportional to respective termination elements coupled to a communication pad, the method further comprising adjusting the termination elements coupled to the communication pad responsive to the adjustments to the first and second replica ODT elements.

16. A method for calibrating on-die-termination (ODT) elements in an integrated circuit, the method comprising:
connecting a calibration pad of the integrated circuit to an external reference resistor that is coupled to an external voltage source;
setting a programmable voltage source instantiated on the integrated circuit to output a first voltage value;
adjusting a control setting for controlling one of a first replica ODT element coupled to the calibration pad, a second replica ODT element coupled to the calibration pad, and a current through a current source coupled to the calibration pad, such that a voltage on the calibration pad is about equal to the first voltage value; and
saving the control setting.

17. The method of claim 16, wherein adjusting the control setting comprises issuing ODT control signals to the first and second replica ODT elements and a current control signal to the current source.

18. The method of claim 17, wherein the ODT elements are parts of integrated communication circuits, the method further comprising distributing at least one of the ODT control signals to the ODT elements.

19. The method of claim 18, further comprising distributing the current control signal to the communication circuits.

* * * * *